(12) United States Patent
Luo

(10) Patent No.: US 6,725,909 B1
(45) Date of Patent: Apr. 27, 2004

(54) HEAT-DISSIPATING DEVICE AND METHOD FOR FABRICATING THE SAME

(76) Inventor: Chin-Kuang Luo, 5F, No. 56, Min-Chuan Rd., Chung Dist., Taichung City (TW)

( * ) Notice: Subject to any disclaimer, the term of this patent is extended or adjusted under 35 U.S.C. 154(b) by 0 days.

(21) Appl. No.: 10/395,546

(22) Filed: Mar. 24, 2003

(30) Foreign Application Priority Data

Jan. 6, 2003 (TW) ........................................ 92100189 A

(51) Int. Cl.⁷ ............................................. F28D 15/00
(52) U.S. Cl. ........................... 165/104.21; 165/104.26; 165/104.33; 361/700; 174/15.2; 257/715
(58) Field of Search ...................... 165/104.21, 104.26, 165/104.33, 185; 361/700; 174/15.2; 257/715

(56) References Cited

U.S. PATENT DOCUMENTS

| 3,603,382 | A | * | 9/1971 | Paine et al. ............ 165/104.26 |
| 5,381,859 | A | * | 1/1995 | Minakami et al. ......... 165/80.3 |
| 5,582,242 | A | * | 12/1996 | Hamburgen et al. ... 165/104.21 |
| 5,582,246 | A | * | 12/1996 | Dinh ......................... 165/181 |
| 6,006,827 | A | * | 12/1999 | Lu ............................ 165/182 |
| 6,382,307 | B1 | * | 5/2002 | Wang et al. ............... 165/80.3 |
| 6,450,250 | B2 | * | 9/2002 | Guerrero ............... 165/104.33 |
| 2002/0080582 | A1 | * | 6/2002 | Chang ........................ 361/700 |
| 2003/0066628 | A1 | * | 4/2003 | Mochizuki et al. .... 165/104.26 |
| 2003/0070791 | A1 | * | 4/2003 | Lin ....................... 165/104.21 |

FOREIGN PATENT DOCUMENTS

JP 60-42593 A * 3/1985 ................ 165/4.26

* cited by examiner

Primary Examiner—Terrell McKinnon
(74) Attorney, Agent, or Firm—Trop, Pruner & Hu, P.C.

(57) ABSTRACT

In a device and method for dissipating heat, a heat fin unit includes a stack of fin plates, each of which has an inner periphery provided with an annular spacer. The annular spacers of the fin plates cooperatively form a heat transfer pipe that contains a heat transfer medium, and that has an upper portion closed by a cover, a lower portion mounted on a heat transfer member disposed on a heat-generating source, and an inner pipe surface having a capillary unit formed therein.

56 Claims, 13 Drawing Sheets

HEAT-DISSIPATING DEVICE AND METHOD FOR FABRICATING THE SAME

CROSS-REFERENCE TO RELATED APPLICATION

This application claims priority of Taiwanese Application No. 092100189, filed on Jan. 6, 2003.

BACKGROUND OF THE INVENTION

1. Field of the Invention

The invention relates to a device and method for dissipating heat, more particularly to a device and method for dissipating heat efficiently.

2. Description of the Related Art

Referring to FIG. 1, a conventional heat-dissipating device 1 is shown to include a heat transfer pipe assembly 11 connected to a heat generating source (not shown), and a heat fin assembly 12 sleeved on the heat transfer pipe assembly 11. The heat transfer pipe assembly 11 includes a base plate 111 connected to the heat generating source, and a heat transfer pipe 112 connected to the base plate 111. The heat fin assembly 12 includes a stack of heat dissipating fin plates 121 sleeved on the heat transfer pipe 112. Each fin plate 121 has an inner periphery that defines a through hole, and includes an annular connecting seat 122 fitted on the heat transfer pipe 112 and extending downwardly from the periphery such that a clearance 13 is defined between each adjacent pair of the fin plates 121 to serve as an air passage. As the heat transfer pipe 112 is known in the art, it will not be described in detail herein for the sake of brevity.

In use, when the working temperature of the heat generating source (e.g., a central processing unit) rises, the heat produced thereby is conducted to the heat transfer pipe 112 of the heat transfer pipe assembly 11 and is dissipated to the ambient through the fin plates 121.

The aforesaid conventional heat-dissipating device 1 is disadvantageous in that the heat transfer pipe 112 and the fin plates 121 are separately formed and require time-consuming assembly work, which means increased costs. Given that the heat transfer pipe 112 and the fin plates 121 are separately formed, a relatively large heat transfer resistance will be encountered in use, which will lower the efficiency of heat transfer. It is especially noted that the fin plates 121 are without any guiding member to guide flow of air through the air passages 13 so as to dissipate residual heat around the fin plates 121. Thus, the heat dissipating effect is not very satisfactory.

SUMMARY OF THE INVENTION

Therefore, the main object of the present invention is to provide a heat-dissipating device that facilitates production, that can be produced at reduced costs, and that permits efficient heat dissipation.

Another object of the present invention is to provide a method for fabricating the aforesaid heat-dissipating device.

According to one aspect of the present invention, a heat-dissipating device includes:
- a heat transfer member adapted to be disposed on a heat generating source;
- a heat fin unit including a stack of heat-dissipating fin plates, each of the fin plates being formed with a through hole and a periphery that defines the through hole and that is formed with an annular spacer, the annular spacer of an upper one of the fin plates being connected securely to the periphery of a lower one of the fin plates such that adjacent ones of the fin plates form a vertical clearance therebetween and such that the annular spacers of the fin plates cooperatively form a heat transfer pipe, the heat transfer pipe having an inner pipe surface, an upper portion, and a lower portion mounted securely on the heat transfer member;
- a heat transfer medium contained in the heat transfer pipe;
- a cover for closing the upper portion of the heat transfer pipe; and
- a capillary unit formed in the inner pipe surface of the heat transfer pipe.

According to another aspect of the present invention, a method for fabricating a heat-dissipating device includes:
- a) forming a heat transfer member which is adapted to be disposed on a heat generating source;
- b) forming a heat fin unit that includes a stack of heat-dissipating fin plates, each of the fin plates being formed with a through hole and a periphery that defines the through hole and that is formed with an annular spacer, wherein the annular spacer of an upper one of the fin plates is connected to the periphery of a lower one of the fin plates such that adjacent ones of the fin plates form a vertical clearance therebetween and such that the annular spacers of the fin plates cooperatively form a heat transfer pipe, the heat transfer pipe having an inner pipe surface, an upper portion, and a lower portion;
- c) forming a capillary unit in the inner pipe surface of the heat transfer pipe;
- d) mounting the lower portion of the heat transfer pipe on the heat transfer member;
- e) providing a heat transfer medium in the heat transfer pipe; and
- f) sealing the upper portion of the heat transfer pipe.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
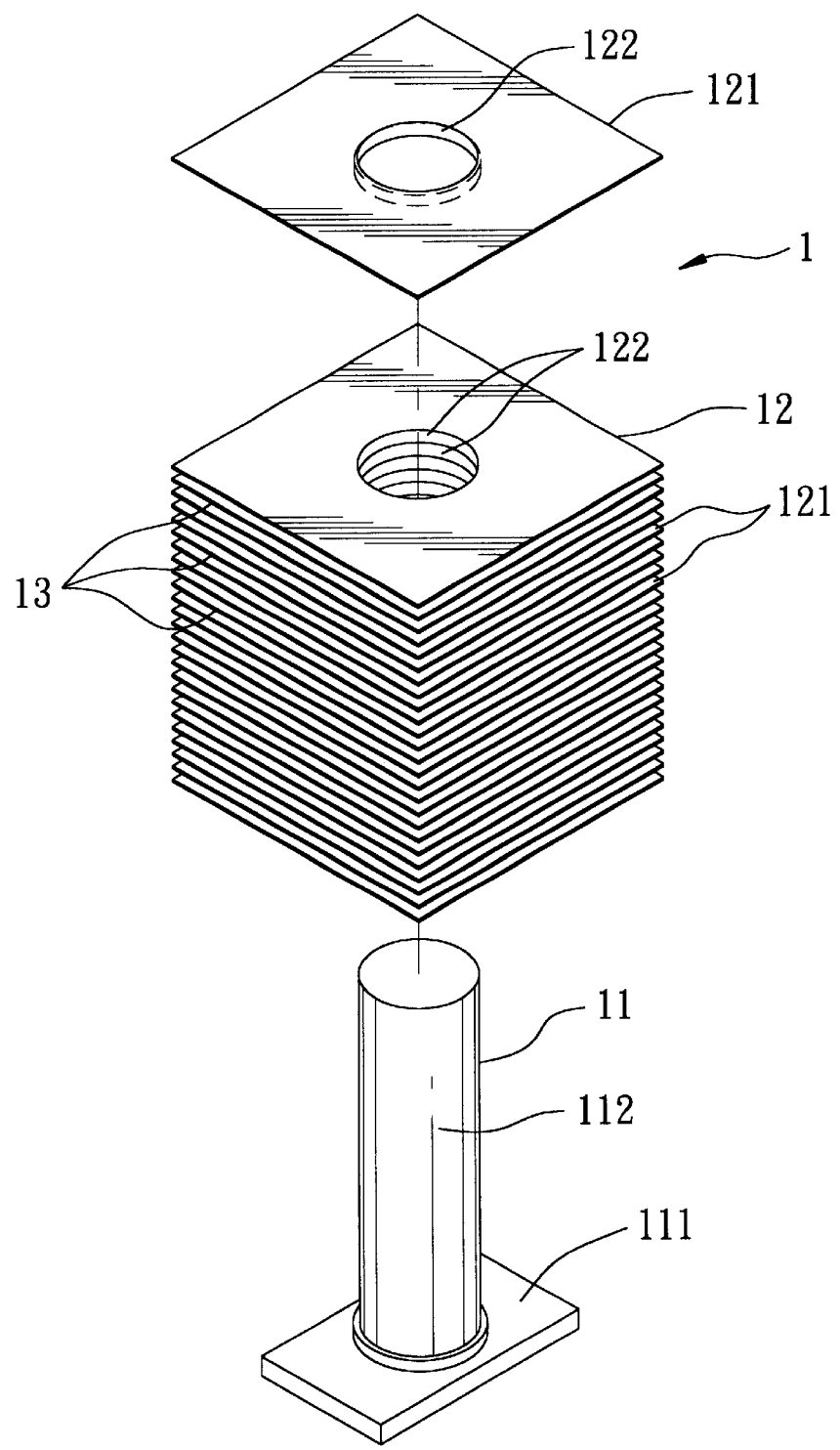
FIG. 1 is an exploded perspective view of a conventional heat-dissipating device.

Before the present invention is described in greater detail, it should be noted that like elements are denoted by the same reference numerals throughout the disclosure.

Figure 2:
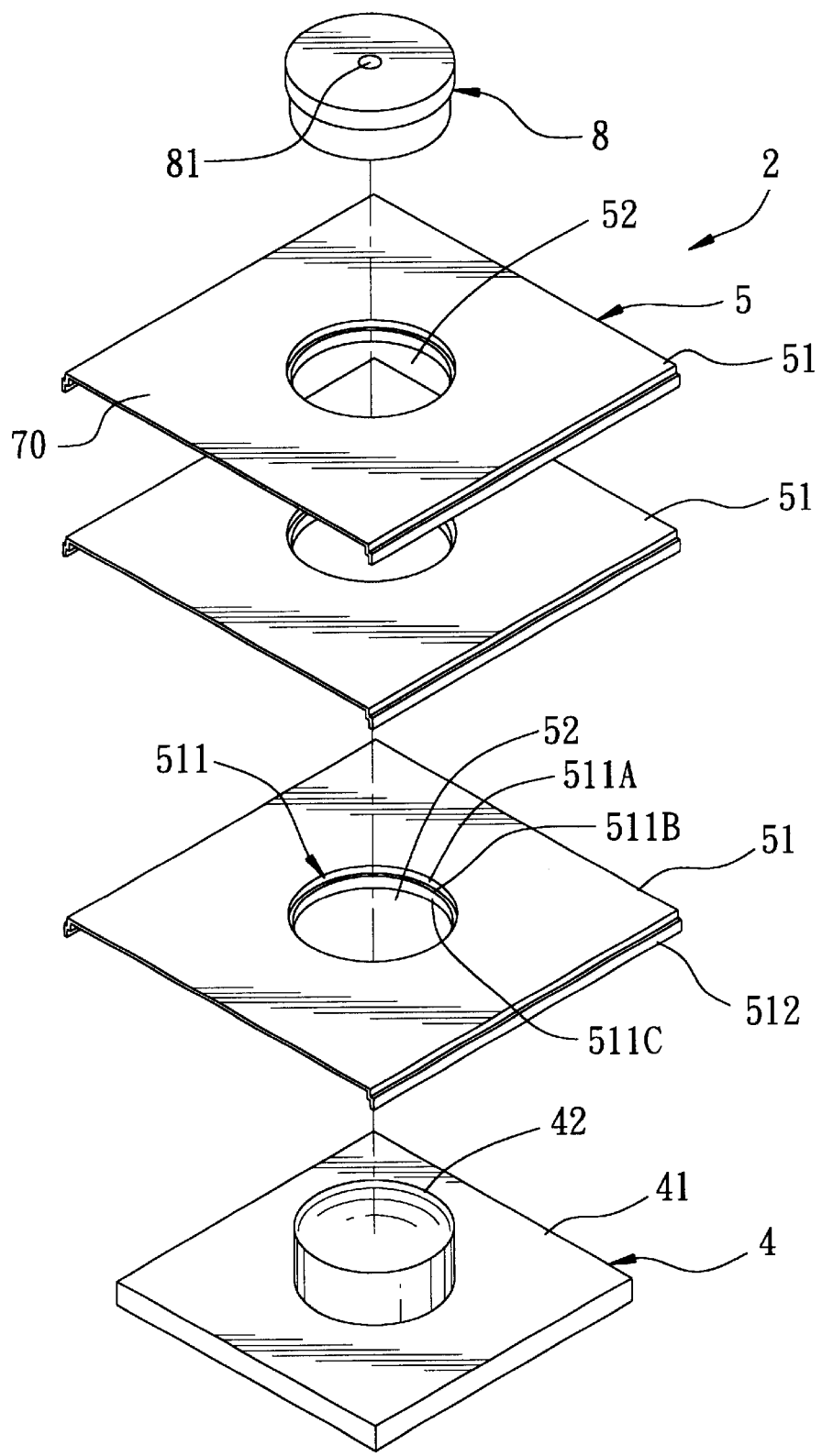
FIG. 2 is an exploded perspective view of the preferred embodiment of a heat-dissipating device according to this invention in part.
Figure 3:
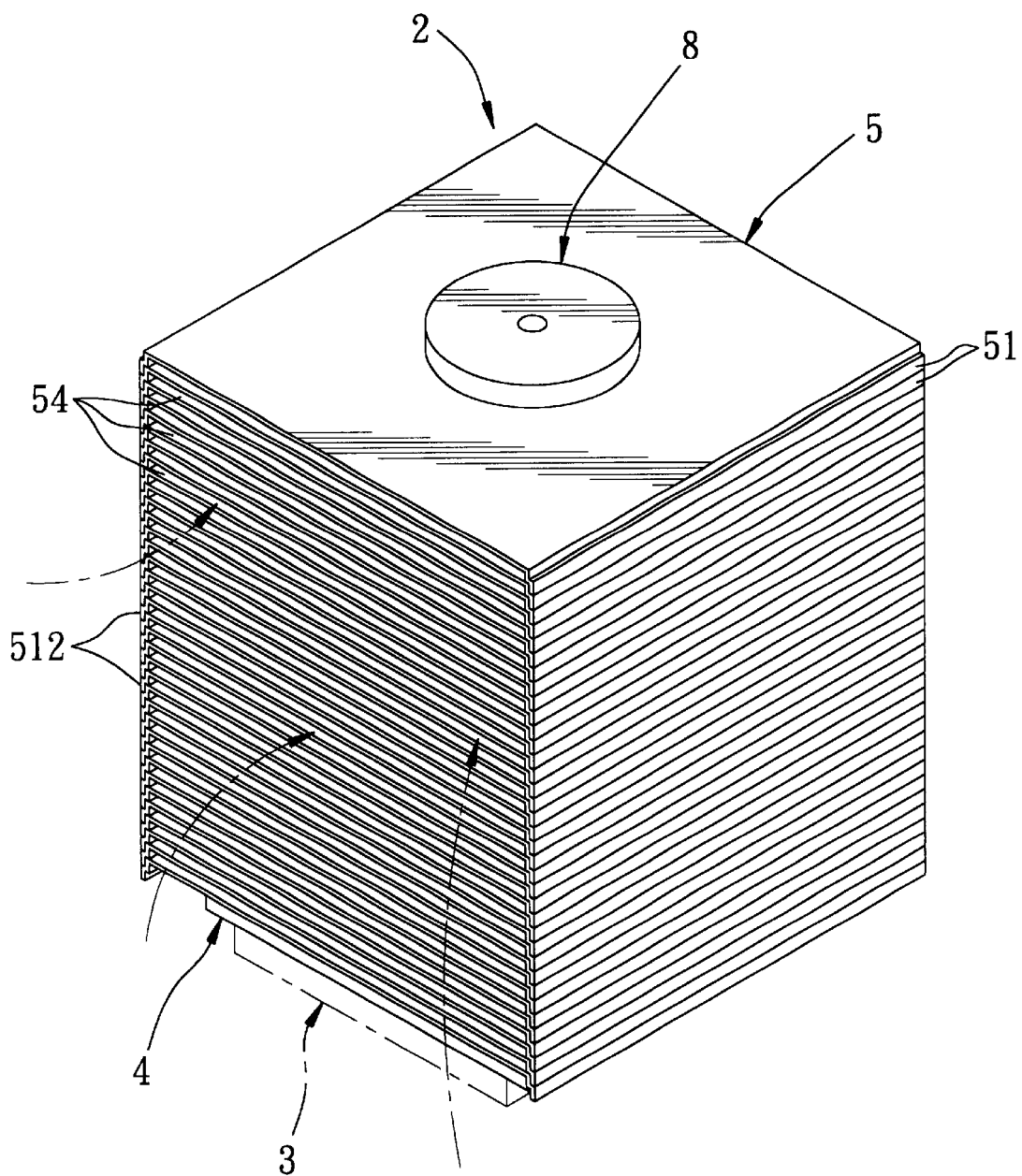
FIG. 3 is a perspective view of the preferred embodiment.
Figure 4:
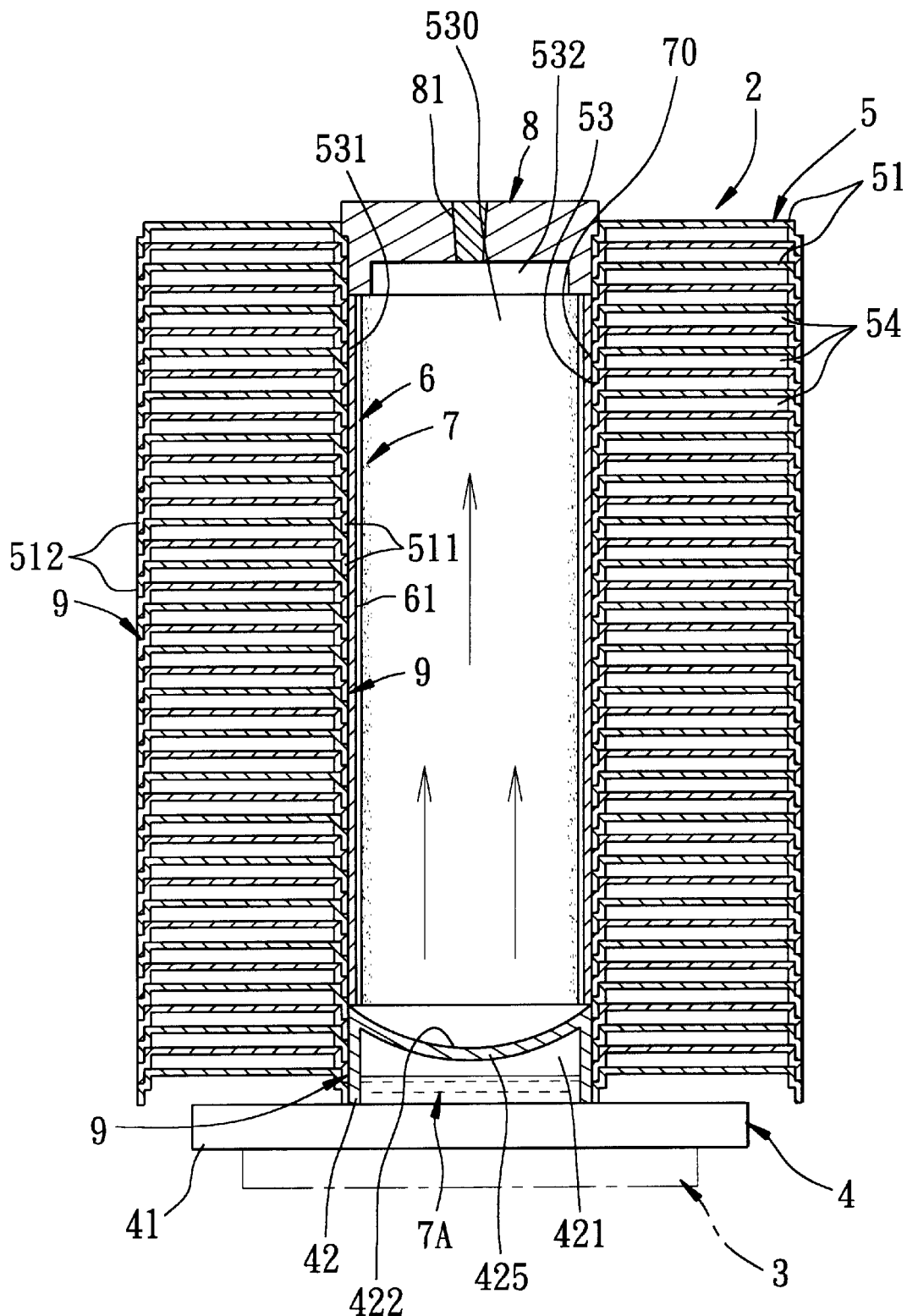
FIG. 4 is a sectional view of the preferred embodiment in an assembled state, in which a heat transfer member is shown to have a post portion with a concave top wall.

Referring to FIGS. 2 to 4, the preferred embodiment of a heat-dissipating device 2 according to the present invention is shown to be adapted for mounting on a heat generating source 3, such as a central processing unit (CPU), an integrated circuit (IC), a circuit module, etc. In this embodiment, the heat generating source 3 is a central processing unit. The heat-dissipating device 2 includes a heat transfer member 4, a heat fin unit 5, a capillary unit 6, a heat transfer medium 7, and a cover 8.

The heat fin unit 5 includes a stack of heat-dissipating fin plates 51, each of which is formed with a through hole 52 and a periphery that defines the through hole 52 and that is formed with an annular spacer 511. The annular spacer 511 of an upper one of the fin plates 51 is connected securely to the periphery of a lower one of the fin plates 51 such that adjacent ones of the fin plates 51 form a vertical clearance 54 therebetween and such that the annular spacers 511 of the fin plates 51 cooperatively form a heat transfer pipe 53. The heat transfer pipe 53 has an inner pipe surface 531, an upper portion with a top opening 532, and a lower portion mounted securely on the heat transfer member 4. The heat transfer medium 7 is contained in the heat transfer pipe 53. The inner pipe surface 531 of the heat transfer pipe 53 may be coated with a thermally conductive material 70 that is of the same composition as that of the heat transfer medium 7.

Figure 10:
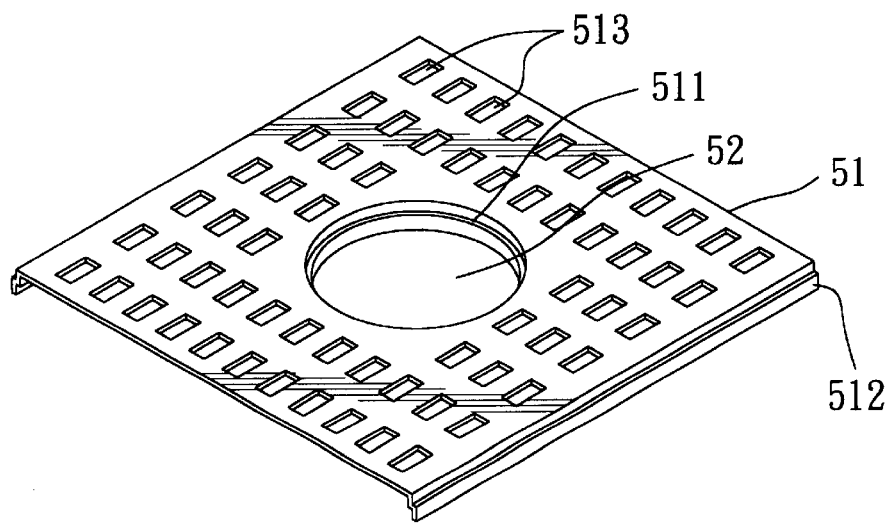
FIG. 10 is a perspective view of a fin plate that is provided with a plurality of vent holes.
Figure 11:
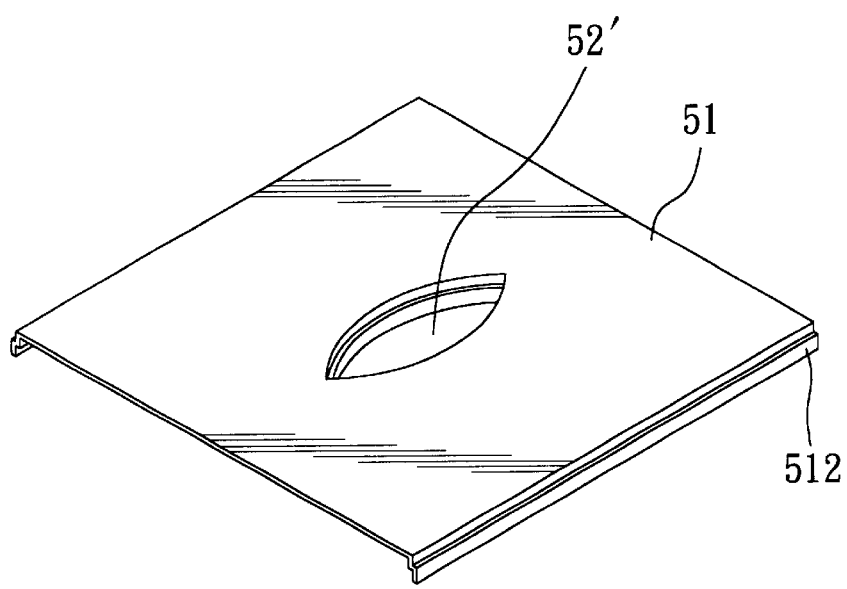
FIG. 11 is a perspective view of a fin plate that is formed with a substantially elliptical through hole.

Referring to FIG. 2, the annular spacer 511 of each fin plate 51 includes an annular first spacer segment 511A that projects downwardly from the periphery of the respective fin plate 51, an annular second spacer segment 511B that projects radially and inwardly from a distal lower end of the first spacer segment 511A, and an annular third spacer segment 511C that projects downwardly from a distal radial inner end of the second spacer segment 511B. Each of the fin plates 51 has two opposite edge portions, each of which is formed with a barrier flange 512. The barrier flanges 512 of an upper one of the fin plates 51 are connected securely to a lower one of the fin plates 51 so as to close two opposite sides of the vertical clearance 54 between the upper and lower ones of the fin plates 51. As such, ambient air is guided to flow into the vertical clearances 54 through the sides of the vertical clearances 54 that are not closed by the barrier flanges 512 so as to carry away residual heat around the fin plates 51 in an efficient manner. It is noted that at least one of the annular spacer 511 and the barrier flanges 512 of each of the fin plates 51 is coated with solder material 9 for welding to the adjacent one of the fin plates 51. Preferably, each of the fin plates 51 is further formed with a set of vent holes 513 therethrough, as shown in FIG. 10, so as to enhance circulation of air through the vertical clearances 54 and reduce resistance to air currents. The vent holes 513 may be configured to be rectangular or circular or have any other suitable geometrical shape. Furthermore, each fin plate 51 maybe configured to have a substantially elliptical through hole 52' (as shown in FIG. 11), a square hole, or a hole of any suitable shape.

The heat transfer member 4 is formed from a metal, such as aluminum and copper, an alloy metal, or any other material of good heat conductivity. The heat transfer member 4 includes a base portion 41 adapted to be disposed on the heat generating source 3, and a post portion 42 extending upwardly from the base portion 41 and connected securely to the lower portion of the heat transfer pipe 53. The post portion 42 extends into and is in sealing engagement with the lower portion of the heat transfer pipe 53. The post portion 42 is coated with solder material 9 for welding to the lower portion of the heat transfer pipe 53.

Figure 12:
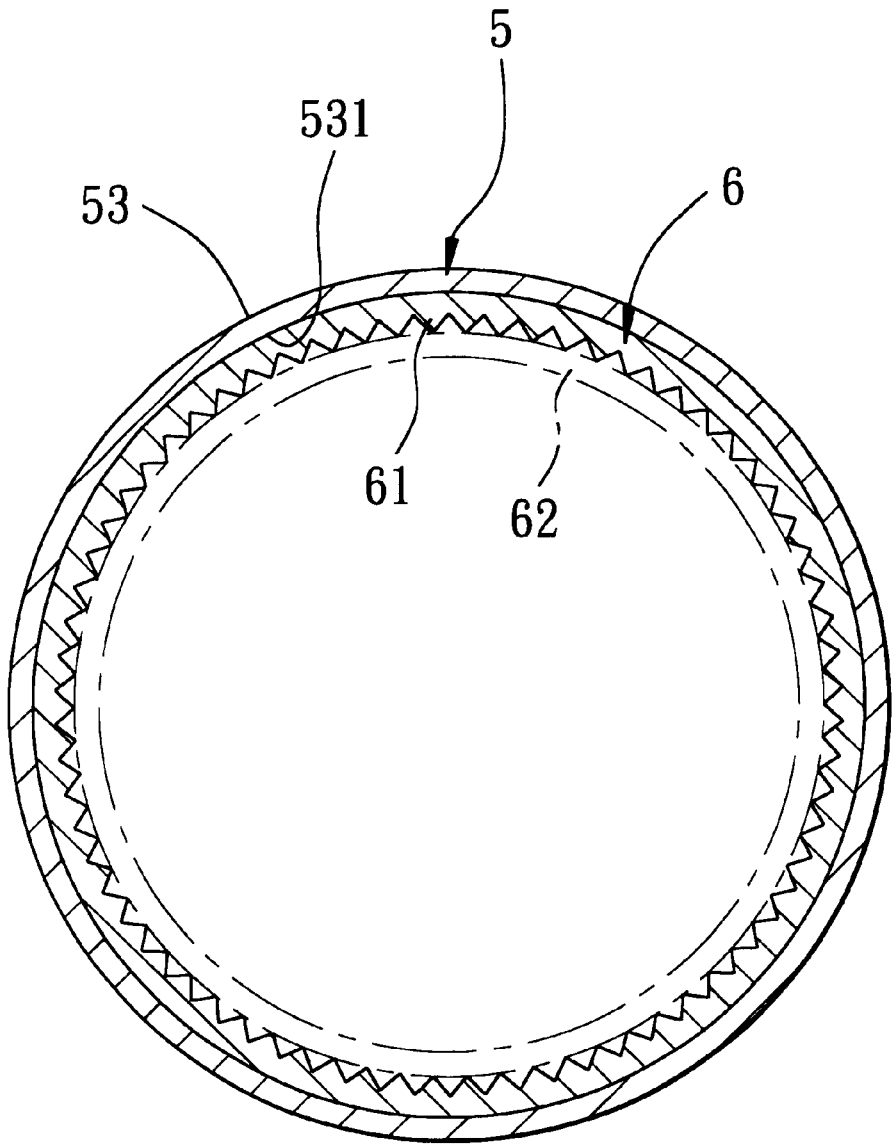
FIG. 12 is a schematic sectional view showing a capillary unit disposed in the heat fin unit.

The capillary unit 6 is formed in the inner pipe surface 531 of the heat transfer pipe 53, and includes a primary capillary structure 61 formed on the inner pipe surface 531. Referring to FIG. 12, the capillary unit 6 may further include a secondary capillary structure 62 disposed on the primary capillary structure 61. The primary capillary structure 61 is a roughened surface formed directly on the inner pipe surface 531. The roughened surface may be an abraded surface formed using sandpaper or a brushed surface formed using a steel brush. Alternatively, the primary capillary structure 61 is formed directly on the inner pipe surface 531 by spraying a heat-treatable material and by subjecting the heat-treatable material to heat treatment. The secondary capillary structure 62 is a metal net fixed on the primary capillary structure 61, or a strip-like spring member. It is noted that the inner pipe surface 531 of the heat transfer pipe 51 may be formed solely with the primary capillary structure 61 or the secondary capillary structure 62.

Figure 13:
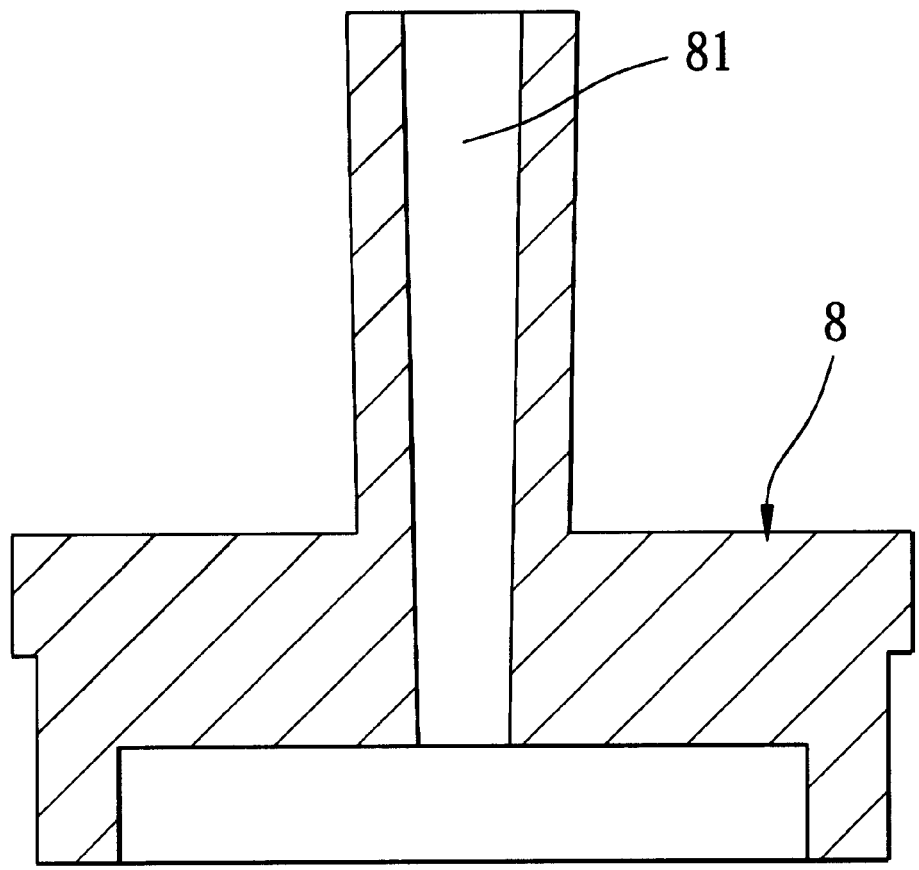
FIG. 13 is a sectional view illustrating a cover with a protrusion.

The cover 8 is disposed to close the top opening 532 in the upper portion of the heat transfer pipe 53. The cover 8 is formed with an inlet 81, preferably having an inverted conical cross section, for filling the heat transfer pipe 53 with the heat transfer medium 7. In practice, after the heat transfer pipe 53 is filled with the heat transfer medium 7, the heat transfer pipe 53 is vacuumed to form a vacuum sealed chamber 530 and is subsequently sealed. The cover 8 may also be configured to have a protrusion extending therefrom, and the inlet 81 extends through the protrusion, as shown in FIG. 13.

In this embodiment, the post portion 42 is hollow and confines a vacuum sealed chamber 421 therein. The vacuum sealed chamber 421 contains an amount of coolant medium 7A therein for heat exchange. The post portion 42 has a top wall 425 with a contact surface 422 that is in contact with the heat transfer medium 7 in the heat transfer pipe 53. In this embodiment, the top wall 425 is concave.

Figure 5:
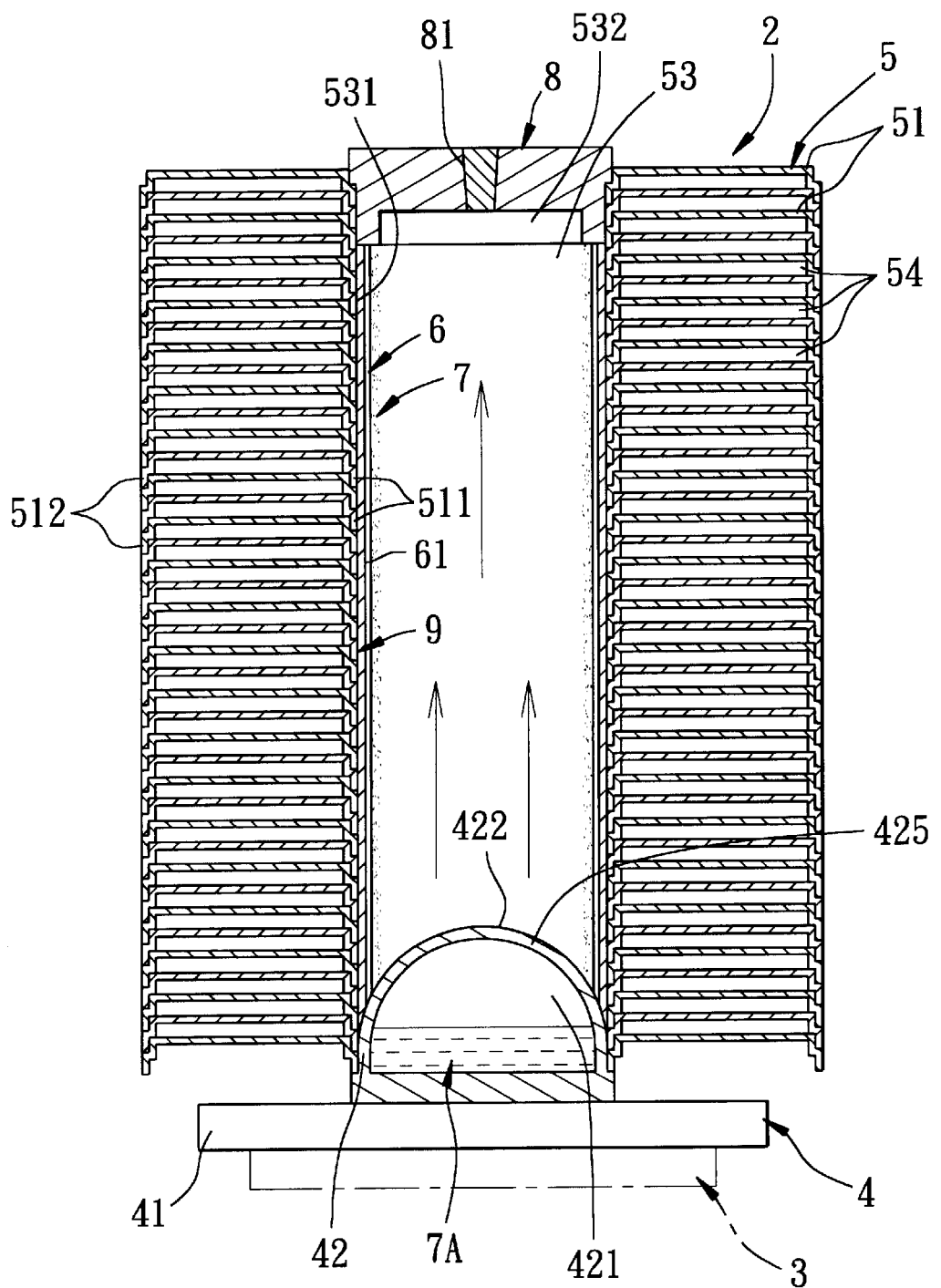
FIG. 5 is a sectional view of a modified embodiment of the heat-dissipating device according to the present invention in an assembled state, in which the post portion of the heat transfer member is shown to have a convex top wall.
Figure 6:
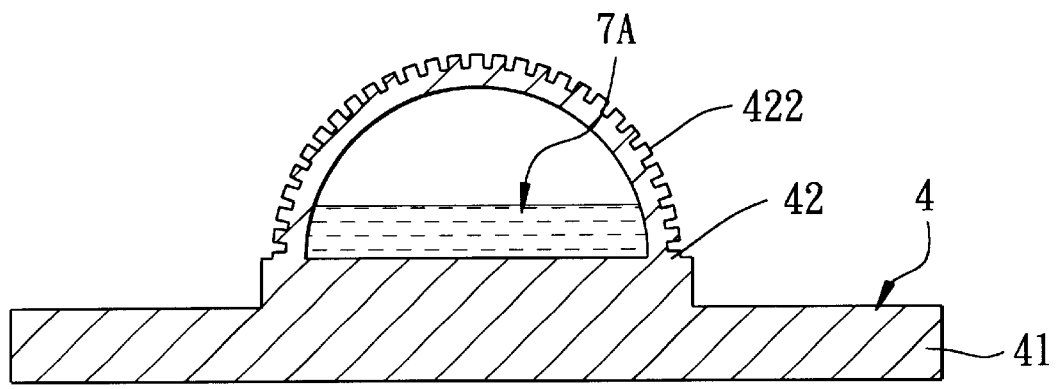
FIG. 6 is a sectional view of the heat transfer member of FIG. 5 in a modified form, in which a contact surface of the convex top wall is configured to be a grooved surface.
Figure 7:
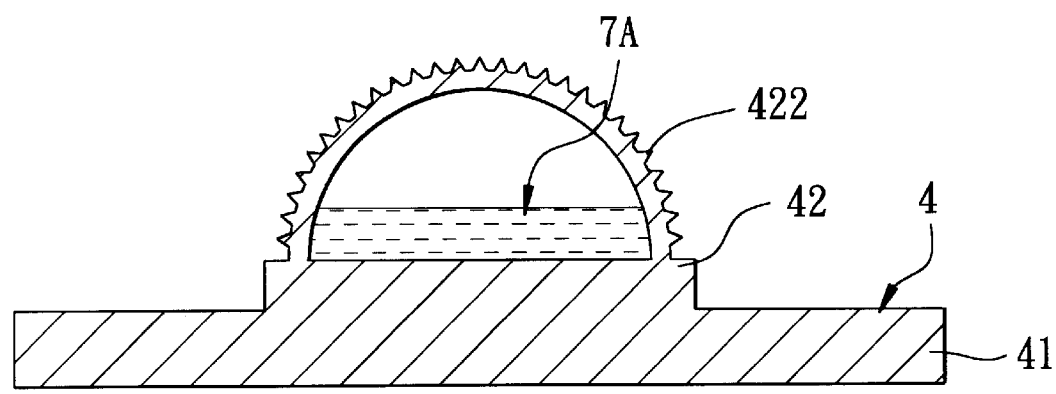
FIG. 7 is similar to FIG. 6, showing the convex top wall to have a teethed surface.

Referring to FIG. 5, in a modified embodiment, the top wall 425 of the post portion 42 is convex, and the contact surface 422 thereof is smooth. In other embodiments, the contact surface 422 can be configured to be a grooved surface as shown in FIG. 6, a teethed surface as shown in FIG. 7, or to have a capillary structure (not shown) to increase the heat transfer surface area so as to enhance heat dissipation.

Figure 8:
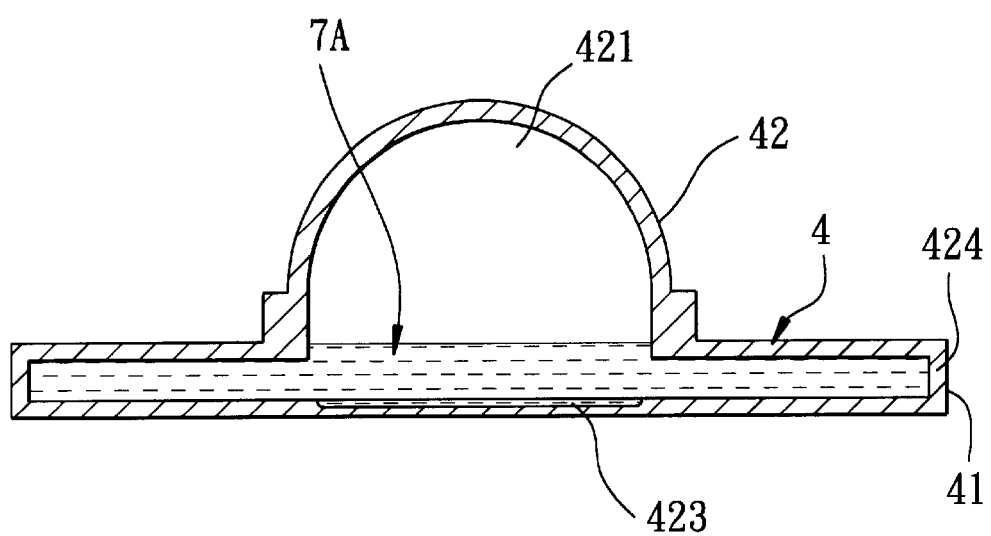
FIG. 8 is a similar to FIG. 6, showing the heat transfer member of yet another embodiment having an inner wall surface provided with at least one coolant groove.

In another modified embodiment shown in FIG. 8, the entire heat transfer member 4 is hollow and confines a vacuum sealed chamber 421. The base portion 41 has a contacting wall 424 with an outer wall surface that is adapted to be disposed on the heat-generating source (not shown), and an inner wall surface that confronts the vacuum sealed chamber 421 and that is formed with at least one coolant groove 423 in fluid communication with the vacuum sealed chamber 421 such that, even if the heat-dissipating device 2 is tilted from an upright position, the coolant medium 7A can be collected in the coolant groove 423 to be excited by the high temperature of the heat-generating source so as to enhance heat transfer.

Figure 9:
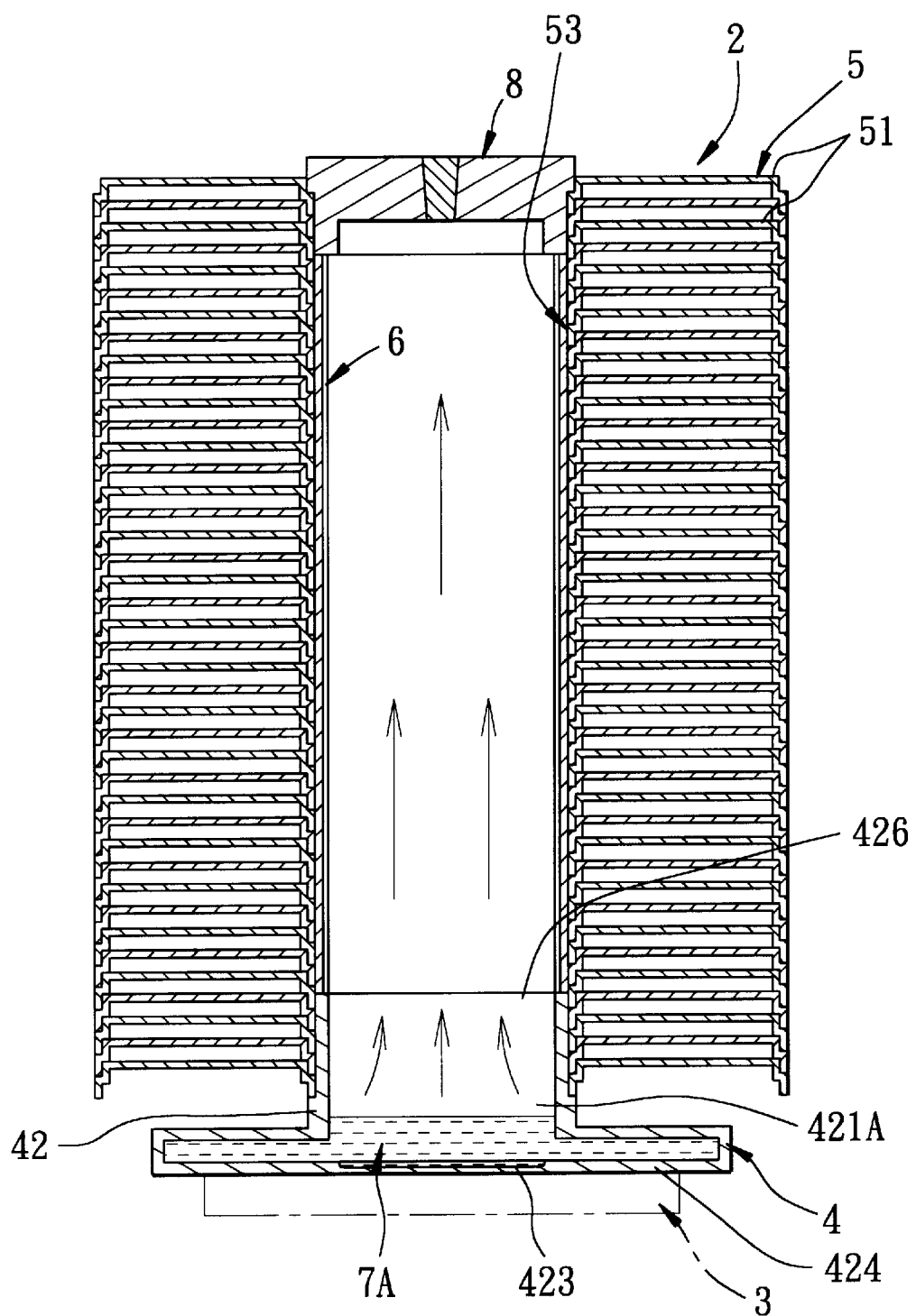
FIG. 9 is a sectional view of still another modified embodiment of the heat-dissipating device according to this invention in an assembled state, in which the post portion of the heat transfer member has an open top end communicated with an interior of a heat transfer pipe of a heat fin unit.

Referring to FIG. 9, in still another modified embodiment, which is similar to the embodiment of FIG. 8, the heat transfer member 4 is hollow and confines a chamber 421A therein, and the post portion 42 has an open top end 426 to permit fluid communication between the chamber 421A and an interior of the heat transfer pipe 53. As such, the heat transfer medium 7 in the heat transfer pipe 53 can flow into the chamber 421A and the coolant groove 423 to serve as the coolant medium 7A.

The containment of the heat transfer medium 7 in the heat transfer pipe 53 can be conducted using one of the following methods depending on the composition of the heat transfer medium 7: (1) Filling the heat transfer pipe 53 with the heat transfer medium 7 at normal pressure; (2) spraying the inner pipe surface 531 with the heat transfer medium 7; (3) vacuuming the heat transfer pipe 53 to form a vacuum sealed chamber and filling the vacuum sealed chamber with a thermally conductive material, such as water, methanol, acetone, ammonia, nitrogen, sodium, lithium, or mixtures thereof; and (4) vacuuming and filling the heat transfer pipe 53 with a superconductor material. The coolant medium 7A can also be disposed in the heat transfer member 4 in like manners. It is noted that the term "filling" can be construed to mean "completely filling" or "partially filling."

It is noted that each of the fin plates 51 may be configured to have a surface coated with a thermally conductive material 70 (see FIG. 2) by spraying or immersion. In use, referring to FIGS. 3, 4, 5 and 9, when the temperature of the heat-generating source 3 rises (for instance, when the central processing unit is in operation), the heat transfer member 4 will quickly transfer a large amount of the heat upward to dissipate the heat. As such, the heat transfer medium 7 in the heat transfer pipe 53 will be excited by the heat. Given that the heat transfer pipe 53 is vacuumed and is at a relatively low pressure (the boiling point of liquid being lower in a vacuum low-pressure space), the heat produced by the heat-generating source 3 can be quickly distributed all over the heat transfer pipe 53. In addition, as the heat fin unit 5 is designed to direct the ambient air through the vertical clearances 54 between the fin plates 51 in guided directions (as indicated by the arrows in FIG. 3), all the residual heat on the fin plates 51 can be carried away by the ambient air, thereby enhancing the heat transfer efficiency.

In addition, since the heat transfer pipe 53 is formed by assembly of the fin plates 51, and since the heat transfer pipe 53 is filled with the heat transfer medium 7, there is no need to provide a separate heat transfer pipe as in the prior art, thereby simplifying the manufacturing process and reducing costs. Moreover, since the heat transfer pipe 53 is integrally formed by the fin plates 51, the thermal transfer resistance is far lower than that encountered in the prior art.

Figure 14:
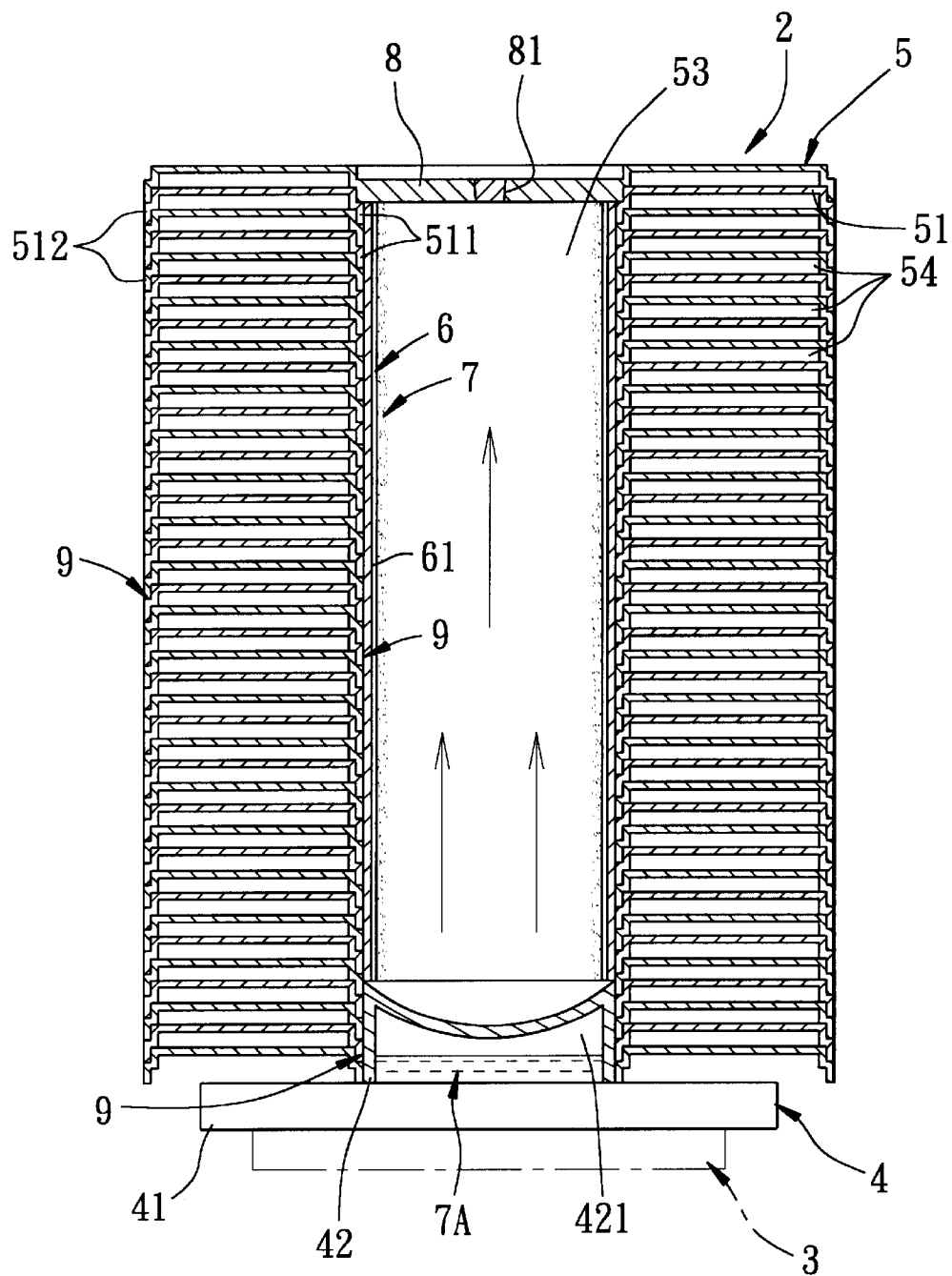
FIG. 14 is a sectional view of yet another modified embodiment of the heat-dissipating device according to this invention, in which an uppermost fin plate is integrally formed with a cover.

FIG. 14 shows yet another modified embodiment of the heat-dissipating device 2 according to the present invention. This embodiment differs from the previous embodiments in that the cover 8' is formed integrally with an uppermost one of the fin plates 51' in the stack.

Figure 15:
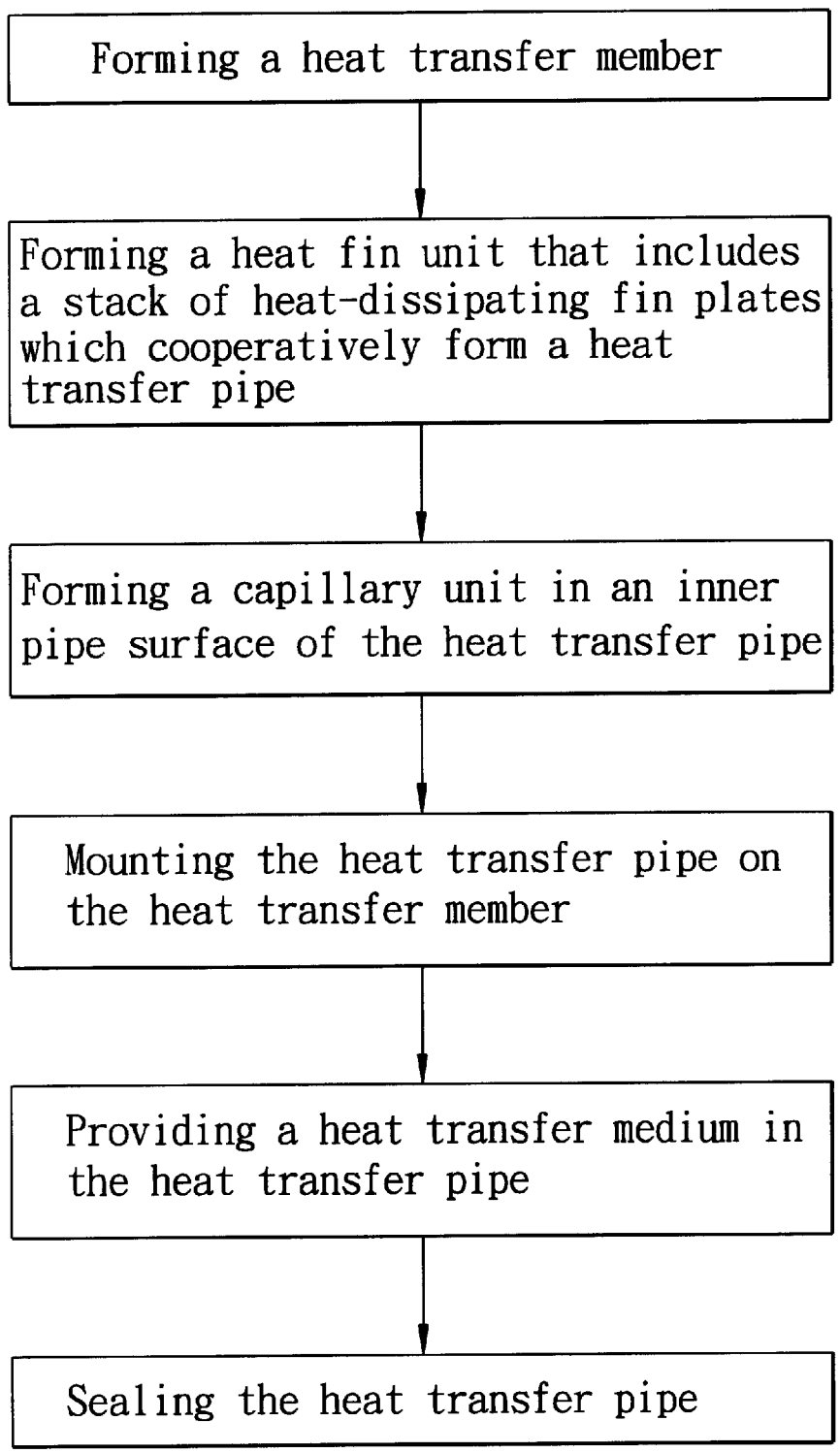
FIG. 15 is a flowchart illustrating the preferred embodiment of a method for fabricating a heat dissipating device according to this invention.

Referring to FIG. 15, in combination with FIGS. 2 to 14, the preferred embodiment of a method for fabricating the aforesaid heat-dissipating device 2 is shown to include the steps of: (a) forming a heat transfer member 4 which is adapted to be disposed on a heat generating source 3; (b) forming a heat fin unit 5 that includes a stack of heat-dissipating fin plates 51, each of the fin plates 51 being formed with a through hole 52 and a periphery that defines the through hole 52 and that is formed with an annular spacer 511, wherein the annular spacer 511 of an upper one of the fin plates 51 is connected to the periphery of a lower one of the fin plates 51 such that adjacent ones of the fin plates 51 form a vertical clearance 54 therebetween and such that the annular spacers 511 of the fin plates 51 cooperatively form a heat transfer pipe 53, the heat transfer pipe 53 having an inner pipe surface 531, an upper portion, and a lower portion; c) forming a capillary unit 6 in the inner pipe surface 531 of the heat transfer pipe 53; (d) mounting the lower portion of the heat transfer pipe 53 on the heat transfer member 4; (e) providing a heat transfer medium 7 in the heat transfer pipe 53; and (f) sealing the upper portion of the heat transfer pipe 53.

The heat-transfer member 4 is formed with a base portion 41 that is adapted to be disposed on the heat generating source 3, and a post portion 42 that extends from the base portion 41 and that is to be connected to the lower portion of the heat transfer pipe 53. The post portion 42 is extended into and engages sealingly the lower portion of the heat transfer pipe 53, and is welded to the lower portion of the heat transfer pipe 53.

In step (a), the heat transfer member 4 confines a vacuum sealed chamber 421 therein, and an amount of coolant medium 7A is provided in the vacuum sealed chamber 421. The base portion 41 is formed with a contacting wall 424 having an outer wall surface that is adapted to be disposed on the heat-generating source 3, and an inner wall surface that confronts the vacuum sealed chamber 421 and that is formed with a coolant groove 423 in fluid communication with the vacuum sealed chamber 421.

The post portion 42 is formed with a top wall 425 having a contact surface 422 that is disposed to be in contact with the heat transfer medium 7 in the heat transfer pipe 53. The top wall 425 can be a concave top wall or a convex top wall. The contact surface 422 of the top wall 425 of the post portion 42 can be formed into a grooved surface or a teethed surface.

Alternatively, the heat transfer member 4 is hollow and confines a chamber 421A therein, the post portion 42 being formed with an open top end 426 to permit fluid communication between the chamber 421A and an interior of the heat transfer pipe 53.

In step (b), the annular spacer 511 of each of the fin plates 51 includes an annular first spacer segment 511A that projects downwardly from the periphery of the fin plate 51, an annular second spacer segment 511B that projects radially and inwardly from a distal lower end of the first spacer segment 511A, and an annular third spacer segment 511C that projects downwardly from a distal radial inner end of the second spacer segment 511B.

Each of the fin plates 51 has opposite edge portions, each of which is formed with a barrier flange 512, the barrier flanges 512 of an upper one of the fin plates 51 being connected to a lower one of the fin plates 51 so as to close opposite sides of the vertical clearance 54 between the upper and lower ones of the fin plates 51.

In step (b), at least one of the annular spacer 511 and the barrier flanges 512 of each of the fin plates 51 is welded to the adjacent one of the fin plates 51. Each of the fin plates 51 is further formed with a set of vent holes 513 therethrough. Furthermore, each of the fin plates 51 has a surface coated with a thermally conductive material.

The heat transfer pipe 53 is vacuumed prior to sealing, and the inner pipe surface 531 is coated with a thermally conductive material 70.

In step (c), a primary capillary structure 61 is formed on the inner pipe surface 531, and a secondary capillary structure 62 is disposed on the primary capillary structure 61. The primary capillary structure 61 is a roughened surface formed directly on the inner pipe surface 531 by abrasion or brushing. Alternatively, the primary capillary structure 61 is formed directly on the inner pipe surface 531 by spraying a heat-treatable material and by subjecting the heat-treatable material to heat treatment. The secondary capillary structure 62 may be a metal net fixed on the primary capillary structure 61.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A heat-dissipating device comprising:
   a heat transfer member adapted to be disposed on a heat generating source;
   a heat fin unit including a stack of heat-dissipating fin plates, each of said fin plates being formed with a through hole and a periphery that defines said through hole and that is formed with an annular spacer, said annular spacer of an upper one of said fin plates being connected securely to said periphery of a lower one of said fin plates such that adjacent ones of said fin plates form a vertical clearance therebetween and such that said annular spacers of said fin plates cooperatively form a heat transfer pipe, said heat transfer pipe having an inner pipe surface, an upper portion, and a lower portion mounted securely on said heat transfer member;
   a heat transfer medium contained in said heat transfer pipe;
   a cover for closing said upper portion of said heat transfer pipe; and
   a capillary unit formed in said inner pipe surface of said heat transfer pipe.

2. The heat-dissipating device as claimed in claim 1, wherein said heat-transfer member includes a base portion adapted to be disposed on the heat generating source, and a post portion extending from said base portion and connected securely to said lower portion of said heat transfer pipe.

3. The heat-dissipating device as claimed in claim 2, wherein said post portion extends into and is in sealing engagement with said lower portion of said heat transfer pipe.

4. The heat-dissipating device as claimed in claim 3, wherein said post portion is coated with solder material for welding to said lower portion of said heat transfer pipe.

5. The heat-dissipating device as claimed in claim 3, wherein said heat transfer member is hollow and confines a vacuum sealed chamber therein.

6. The heat-dissipating device as claimed in claim 5, wherein said vacuum sealed chamber contains an amount of coolant medium therein for heat exchange.

7. The heat-dissipating device as claimed in claim 6, wherein said base portion has a contacting wall with an outer wall surface that is adapted to be disposed on the heat-generating source, and an inner wall surface that confronts said vacuum sealed chamber and that is formed with a coolant groove in fluid communication with said vacuum sealed chamber.

8. The heat-dissipating device as claimed in claim 6, wherein said post portion has a concave top wall in contact with said heat transfer medium in said heat transfer pipe.

9. The heat-dissipating device as claimed in claim 6, wherein said post portion has a convex top wall in contact with said heat transfer medium in said heat transfer pipe.

10. The heat-dissipating device as claimed in claim 3, wherein said heat transfer member is hollow and confines a chamber therein, said post portion having an open top end to permit fluid communication between said chamber and an interior of said heat transfer pipe.

11. The heat-dissipating device as claimed in claim 6, wherein said post portion has a top wall with a contact surface that is in contact with said heat transfer medium in said heat transfer pipe.

12. The heat-dissipating device as claimed in claim 11, wherein said contact surface of said top wall of said post portion is a teethed surface.

13. The heat-dissipating device as claimed in claim 11, wherein said contact surface of said top wall of said post portion is a grooved surface.

14. The heat-dissipating device as claimed in claim 1, wherein said annular spacer includes an annular first spacer segment that projects downwardly from said periphery of said fin plate, an annular second spacer segment that projects radially and inwardly from a distal lower end of said first spacer segment, and an annular third spacer segment that projects downwardly from a distal radial inner end of said second spacer segment.

15. The heat-dissipating device as claimed in claim 1, wherein each of said fin plates has opposite edge portions, each of which is formed with a barrier flange, said barrier flanges of an upper one of said fin plates being connected securely to a lower one of said fin plates so as to close opposite sides of said vertical clearance between the upper and lower ones of said fin plates.

16. The heat-dissipating device as claimed in claim 15, wherein at least one of said annular spacer and said barrier flanges of each of said fin plates is coated with solder material for welding to the adjacent one of said fin plates.

17. The heat-dissipating device as claimed in claim 1, wherein said cover is formed with an inlet for filling said heat transfer pipe with said heat transfer medium.

18. The heat-dissipating device as claimed in claim 1, wherein said cover is formed integrally with an uppermost one of said fin plates in said stack.

19. The heat-dissipating device as claimed in claim 1, wherein each of said fin plates is further formed with a set of vent holes therethrough.

20. The heat-dissipating device as claimed in claim 1, wherein each of said fin plates has a surface coated with a thermally conductive material.

21. The heat-dissipating device as claimed in claim 1, wherein said inner pipe surface is coated with a thermally conductive material.

22. The heat-dissipating device as claimed in claim 1, wherein said heat transfer pipe confines a vacuum sealed chamber.

23. The heat-dissipating device as claimed in claim 1, wherein said capillary unit includes a primary capillary structure formed on said inner pipe surface.

24. The heat-dissipating device as claimed in claim 23, wherein said capillary unit further includes a secondary capillary structure disposed on said primary capillary structure.

25. The heat-dissipating device as claimed in claim 23, wherein said primary capillary structure is a roughened surface formed directly on said inner pipe surface.

26. The heat-dissipating device as claimed in claim 25, wherein said roughened surface is an abraded surface.

27. The heat-dissipating device as claimed in claim 25, wherein said roughened surface is a brushed surface.

28. The heat-dissipating device as claimed in claim 23, wherein said primary capillary structure is formed directly on said inner pipe surface by spraying a heat-treatable material and by subjecting the heat-treatable material to heat treatment.

29. The heat-dissipating device as claimed in claim 24, wherein said secondary capillary structure is a metal net fixed on said primary capillary structure.

30. A method for fabricating a heat-dissipating device, comprising:
   a) forming a heat transfer member which is adapted to be disposed on a heat generating source;
   b) forming a heat fin unit that includes a stack of heat-dissipating fin plates, each of the fin plates being formed with a through hole and a periphery that defines the through hole and that is formed with an annular spacer, wherein the annular spacer of an upper one of the fin plates is connected to the periphery of a lower one of the fin plates such that adjacent ones of the fin plates form a vertical clearance therebetween and such that the annular spacers of the fin plates cooperatively form a heat transfer pipe, the heat transfer pipe having an inner pipe surface, an upper portion, and a lower portion;
   c) forming a capillary unit in the inner pipe surface of the heat transfer pipe;
   d) mounting the lower portion of the heat transfer pipe on the heat transfer member;
   e) providing a heat transfer medium in the heat transfer pipe; and
   f) sealing the upper portion of the heat transfer pipe.

31. The method of claim 30, wherein, in step a), the heat-transfer member is formed with a base portion that is adapted to be disposed on the heat generating source, and a post portion that extends from the base portion and that is to be connected to the lower portion of the heat transfer pipe.

32. The method of claim 31, wherein, in step d), the post portion is extended into and engages sealingly the lower portion of the heat transfer pipe.

33. The method of claim 32, wherein, in step d), the post portion is welded to the lower portion of the heat transfer pipe.

34. The method of claim 32, wherein, in step a), the heat transfer member is hollow and confines a vacuum sealed chamber therein.

35. The method of claim 34, wherein step a) includes the sub-step of providing an amount of coolant medium in the vacuum sealed chamber.

36. The method of claim 35, wherein, in step a), the base portion is formed with a contacting wall having an outer wall surface that is adapted to be disposed on the heat-generating source, and an inner wall surface that confronts the vacuum sealed chamber and that is formed with a coolant groove in fluid communication with the vacuum sealed chamber.

37. The method of claim 35, wherein, in step a), the post portion is formed with a concave top wall to be disposed in contact with the heat transfer medium in the heat transfer pipe.

38. The method of claim 35, wherein, in step a), the post portion is formed with a convex top wall to be disposed in contact with the heat transfer medium in the heat transfer pipe.

39. The method of claim 32, wherein, in step a), the heat transfer member is hollow and confines a chamber therein, the post portion being formed with an open top end to permit fluid communication between the chamber and an interior of the heat transfer pipe.

40. The method of claim 35, wherein, in step a), the post portion is formed with a top wall having a contact surface that is to be disposed in contact with the heat transfer medium in the heat transfer pipe.

41. The method of claim 40, wherein step a) includes the sub-step of forming the contact surface of the top wall of the post portion into a teethed surface.

42. The method of claim 40, wherein step a) includes the sub-step of forming the contact surface of the top wall of the post portion into a grooved surface.

43. The method of claim 30, wherein, in step b), the annular spacer includes an annular first spacer segment that projects downwardly from the periphery of the fin plate, an annular second spacer segment that projects radially and inwardly from a distal lower end of the first spacer segment, and an annular third spacer segment that projects downwardly from a distal radial inner end of the second spacer segment.

44. The method of claim 30, wherein, in step b), each of the fin plates has opposite edge portions, each of which is formed with a barrier flange, the barrier flanges of an upper one of the fin plates being connected to a lower one of the fin plates so as to close opposite sides of the vertical clearance between the upper and lower ones of the fin plates.

45. The method of claim 44, wherein, in step b), at least one of the annular spacer and the barrier flanges of each of the fin plates is welded to the adjacent one of the fin plates.

46. The method of claim 30, wherein, in step b), each of the fin plates is further formed with a set of vent holes therethrough.

47. The method of claim 30, wherein step b) includes the sub-step of coating a surface of each of the fin plates with a thermally conductive material.

48. The method of claim 30, wherein step b) includes the sub-step of coating the inner pipe surface with a thermally conductive material.

49. The method of claim 30, wherein the heat transfer pipe is vacuumed prior to sealing.

50. The method of claim 30, wherein step c) includes the sub-step of forming a primary capillary structure on the inner pipe surface.

51. The method of claim 50, wherein step c) includes the sub-step of disposing a secondary capillary structure on the primary capillary structure.

52. The method of claim 50, wherein the primary capillary structure is a roughened surface formed directly on the inner pipe surface.

53. The method of claim 52, wherein the roughened surface is formed by abrasion.

54. The method of claim 52, wherein the roughened surface is formed by brushing.

55. The method of claim 50, wherein the primary capillary structure is formed directly on the inner pipe surface by spraying a heat-treatable material and by subjecting the heat-treatable material to heat treatment.

56. The method of claim 51, wherein the secondary capillary structure is a metal net fixed on the primary capillary structure.

* * * * *